United States Patent
Nandury

(10) Patent No.: US 9,491,538 B2
(45) Date of Patent: Nov. 8, 2016

(54) ADAPTIVE GAIN CONTROL FOR DIGITAL AUDIO SAMPLES IN A MEDIA STREAM

(71) Applicant: SLING MEDIA PVT LTD, Bangalore (IN)

(72) Inventor: Venkata Kishore Nandury, Bangalore (IN)

(73) Assignee: Sling Media PVT Ltd., Bangalore (IN)

( * ) Notice: Subject to any disclaimer, the term of this patent is extended or adjusted under 35 U.S.C. 154(b) by 720 days.

(21) Appl. No.: 13/848,535

(22) Filed: Mar. 21, 2013

(65) Prior Publication Data

US 2013/0208918 A1     Aug. 15, 2013

Related U.S. Application Data

(62) Division of application No. 12/507,971, filed on Jul. 23, 2009, now Pat. No. 8,406,431.

(51) Int. Cl.
| | |
|---|---|
| *G06F 17/00* | (2006.01) |
| *H04R 3/00* | (2006.01) |
| *H03G 7/00* | (2006.01) |
| *G10L 21/0364* | (2013.01) |

(52) U.S. Cl.
CPC ............. *H04R 3/00* (2013.01); *G10L 21/0364* (2013.01); *H03G 7/007* (2013.01); *H04S 2400/13* (2013.01)

(58) Field of Classification Search
CPC .... G10L 21/0364; H03G 7/007; H04R 3/00; H04S 2400/13
See application file for complete search history.

(56) References Cited

U.S. PATENT DOCUMENTS

| | | | |
|---|---|---|---|
| 3,416,043 A | 12/1968 | Jorgensen | |
| 4,254,303 A | 3/1981 | Takizawa | |
| 5,161,021 A | 11/1992 | Tsai | |
| 5,237,648 A | 8/1993 | Mills et al. | |

(Continued)

FOREIGN PATENT DOCUMENTS

| | | |
|---|---|---|
| CN | 1464685 | 12/2003 |
| CN | 101110217 A | 1/2008 |

(Continued)

OTHER PUBLICATIONS

Japan Patent Office, "Notice of Rejection Ground" mailed May 21, 2013 for Japanese Patent Application No. 2012-521672.

(Continued)

*Primary Examiner* — Fan Tsang
*Assistant Examiner* — Eugene Zhao
(74) *Attorney, Agent, or Firm* — LK Global

(57) ABSTRACT

An adaptive gain control system and related operating method for digital audio samples is provided. The method is suitable for use with a digital media encoding system that transmits encoded media streams to a remotely-located presentation device such as a media player. The method begins by initializing the processing of a media stream. Then, the method adjusts the gain of a first set of digital audio samples in the media stream using a fast gain adaptation scheme, resulting in a first group of gain-adjusted digital audio samples having normalized volume during presentation. The method continues by adjusting the gain of a second set of digital audio samples in the media stream using a steady state gain adaptation scheme that is different than the fast gain adaptation scheme, resulting in a second group of gain-adjusted digital audio samples having normalized volume during presentation.

18 Claims, 4 Drawing Sheets

(56) References Cited

U.S. PATENT DOCUMENTS

| | | |
|---|---|---|
| 5,386,493 A | 1/1995 | Degen et al. |
| 5,434,590 A | 7/1995 | Dinwiddie, Jr. et al. |
| 5,493,638 A | 2/1996 | Hooper et al. |
| 5,602,589 A | 2/1997 | Vishwanath et al. |
| 5,661,516 A | 8/1997 | Carles |
| 5,666,426 A | 9/1997 | Helms |
| 5,682,195 A | 10/1997 | Hendricks et al. |
| 5,706,290 A | 1/1998 | Shaw et al. |
| 5,708,961 A | 1/1998 | Hylton et al. |
| 5,710,605 A | 1/1998 | Nelson |
| 5,722,041 A | 2/1998 | Freadman |
| 5,757,416 A | 5/1998 | Birch et al. |
| 5,764,689 A | 6/1998 | Walley |
| 5,774,170 A | 6/1998 | Hite et al. |
| 5,778,077 A | 7/1998 | Davidson |
| 5,794,116 A | 8/1998 | Matsuda et al. |
| 5,822,537 A | 10/1998 | Katseff et al. |
| 5,831,664 A | 11/1998 | Wharton et al. |
| 5,850,482 A | 12/1998 | Meany et al. |
| 5,852,437 A | 12/1998 | Wugofski et al. |
| 5,880,721 A | 3/1999 | Yen |
| 5,889,506 A | 3/1999 | Lopresti et al. |
| 5,898,679 A | 4/1999 | Brederveld et al. |
| 5,909,518 A | 6/1999 | Chui |
| 5,911,582 A | 6/1999 | Redford et al. |
| 5,922,072 A | 7/1999 | Hutchinson et al. |
| 5,936,968 A | 8/1999 | Lyons |
| 5,968,132 A | 10/1999 | Tokunaga |
| 5,987,501 A | 11/1999 | Hamilton et al. |
| 6,002,450 A | 12/1999 | Darbee et al. |
| 6,008,777 A | 12/1999 | Yiu |
| 6,014,694 A | 1/2000 | Aharoni et al. |
| 6,020,880 A | 2/2000 | Naimpally |
| 6,031,940 A | 2/2000 | Chui et al. |
| 6,036,601 A | 3/2000 | Heckel |
| 6,040,829 A | 3/2000 | Croy et al. |
| 6,043,837 A | 3/2000 | Driscoll, Jr. et al. |
| 6,049,671 A | 4/2000 | Slivka et al. |
| 6,075,906 A | 6/2000 | Fenwick et al. |
| 6,088,777 A | 7/2000 | Sorber |
| 6,097,441 A | 8/2000 | Allport |
| 6,104,334 A | 8/2000 | Allport |
| 6,108,041 A | 8/2000 | Faroudja et al. |
| 6,115,420 A | 9/2000 | Wang |
| 6,117,126 A | 9/2000 | Appelbaum et al. |
| 6,141,059 A | 10/2000 | Boyce et al. |
| 6,141,447 A | 10/2000 | Linzer et al. |
| 6,160,544 A | 12/2000 | Hayashi et al. |
| 6,201,536 B1 | 3/2001 | Hendricks et al. |
| 6,212,282 B1 | 4/2001 | Mershon |
| 6,222,885 B1 | 4/2001 | Chaddha et al. |
| 6,223,211 B1 | 4/2001 | Hamilton et al. |
| 6,240,459 B1 | 5/2001 | Roberts et al. |
| 6,240,531 B1 | 5/2001 | Spilo et al. |
| 6,243,596 B1 | 6/2001 | Kikinis |
| 6,256,019 B1 | 7/2001 | Allport |
| 6,263,503 B1 | 7/2001 | Margulis |
| 6,279,029 B1 | 8/2001 | Sampat et al. |
| 6,282,714 B1 | 8/2001 | Ghori et al. |
| 6,286,142 B1 | 9/2001 | Ehreth |
| 6,310,886 B1 | 10/2001 | Barton |
| 6,340,994 B1 | 1/2002 | Margulis et al. |
| 6,353,885 B1 | 3/2002 | Herzi et al. |
| 6,356,945 B1 | 3/2002 | Shaw et al. |
| 6,357,021 B1 | 3/2002 | Kitagawa et al. |
| 6,370,688 B1 | 4/2002 | Hejna, Jr. |
| 6,389,467 B1 | 5/2002 | Eyal |
| 6,434,113 B1 | 8/2002 | Gubbi |
| 6,442,067 B1 | 8/2002 | Chawla et al. |
| 6,456,340 B1 | 9/2002 | Margulis |
| 6,466,623 B1 | 10/2002 | Youn et al. |
| 6,470,378 B1 | 10/2002 | Tracton et al. |
| 6,476,826 B1 | 11/2002 | Plotkin et al. |
| 6,487,319 B1 | 11/2002 | Chai |
| 6,493,874 B2 | 12/2002 | Humpleman |
| 6,496,122 B2 | 12/2002 | Sampsell |
| 6,505,169 B1 | 1/2003 | Bhagavath et al. |
| 6,510,177 B1 | 1/2003 | De Bonet et al. |
| 6,529,506 B1 | 3/2003 | Yamamoto et al. |
| 6,553,147 B2 | 4/2003 | Chai et al. |
| 6,557,031 B1 | 4/2003 | Mimura et al. |
| 6,563,931 B1 | 5/2003 | Soli et al. |
| 6,564,004 B1 | 5/2003 | Kadono |
| 6,567,984 B1 | 5/2003 | Allport |
| 6,584,201 B1 | 6/2003 | Konstantinou et al. |
| 6,584,559 B1 | 6/2003 | Huh et al. |
| 6,597,375 B1 | 7/2003 | Yawitz |
| 6,598,159 B1 | 7/2003 | McAlister et al. |
| 6,600,838 B2 | 7/2003 | Chui |
| 6,609,253 B1 | 8/2003 | Swix et al. |
| 6,611,530 B1 | 8/2003 | Apostolopoulos |
| 6,628,716 B1 | 9/2003 | Tan et al. |
| 6,642,939 B1 | 11/2003 | Vallone et al. |
| 6,647,015 B2 | 11/2003 | Malkemes et al. |
| 6,658,019 B1 | 12/2003 | Chen et al. |
| 6,665,751 B1 | 12/2003 | Chen et al. |
| 6,665,813 B1 | 12/2003 | Forsman et al. |
| 6,668,261 B1 | 12/2003 | Basso et al. |
| 6,697,356 B1 | 2/2004 | Kretschmer et al. |
| 6,701,380 B2 | 3/2004 | Schneider et al. |
| 6,704,678 B2 | 3/2004 | Minke et al. |
| 6,704,847 B1 | 3/2004 | Six et al. |
| 6,708,231 B1 | 3/2004 | Kitagawa |
| 6,718,551 B1 | 4/2004 | Swix et al. |
| 6,748,092 B1 | 6/2004 | Baekgaard |
| 6,754,266 B2 | 6/2004 | Bahl et al. |
| 6,754,439 B1 | 6/2004 | Hensley et al. |
| 6,757,851 B1 | 6/2004 | Park et al. |
| 6,757,906 B1 | 6/2004 | Look et al. |
| 6,766,376 B2 | 7/2004 | Price |
| 6,768,775 B1 | 7/2004 | Wen et al. |
| 6,771,828 B1 | 8/2004 | Malvar |
| 6,774,912 B1 | 8/2004 | Ahmed et al. |
| 6,781,601 B2 | 8/2004 | Cheung |
| 6,785,700 B2 | 8/2004 | Masud et al. |
| 6,795,638 B1 | 9/2004 | Skelley, Jr. |
| 6,798,838 B1 | 9/2004 | Ngo |
| 6,806,909 B1 | 10/2004 | Radha et al. |
| 6,807,308 B2 | 10/2004 | Chui et al. |
| 6,816,194 B2 | 11/2004 | Zhang et al. |
| 6,816,858 B1 | 11/2004 | Coden et al. |
| 6,826,242 B2 | 11/2004 | Ojard et al. |
| 6,834,123 B2 | 12/2004 | Acharya et al. |
| 6,839,079 B2 | 1/2005 | Barlow et al. |
| 6,847,468 B2 | 1/2005 | Ferriere |
| 6,850,571 B2 | 2/2005 | Tardif |
| 6,850,649 B1 | 2/2005 | Malvar |
| 6,868,083 B2 | 3/2005 | Apostolopoulos et al. |
| 6,889,385 B1 | 5/2005 | Rakib et al. |
| 6,892,359 B1 | 5/2005 | Nason et al. |
| 6,898,583 B1 | 5/2005 | Rising, III |
| 6,907,602 B2 | 6/2005 | Tsai et al. |
| 6,927,685 B2 | 8/2005 | Wathen |
| 6,930,661 B2 | 8/2005 | Uchida et al. |
| 6,941,575 B2 | 9/2005 | Allen |
| 6,944,880 B1 | 9/2005 | Allen |
| 6,952,595 B2 | 10/2005 | Ikedo et al. |
| 6,981,050 B1 | 12/2005 | Tobias et al. |
| 7,016,337 B1 | 3/2006 | Wu et al. |
| 7,020,892 B2 | 3/2006 | Levesque et al. |
| 7,032,000 B2 | 4/2006 | Tripp |
| 7,047,305 B1 | 5/2006 | Brooks et al. |
| 7,110,558 B1 | 9/2006 | Elliott |
| 7,124,366 B2 | 10/2006 | Foreman et al. |
| 7,151,575 B1 | 12/2006 | Landry et al. |
| 7,155,734 B1 | 12/2006 | Shimomura et al. |
| 7,155,735 B1 | 12/2006 | Ngo et al. |
| 7,184,433 B1 | 2/2007 | Oz |
| 7,224,323 B2 | 5/2007 | Uchida et al. |
| 7,239,800 B2 | 7/2007 | Bilbrey |
| 7,344,084 B2 | 3/2008 | DaCosta |
| 7,430,686 B1 | 9/2008 | Wang et al. |
| 7,464,396 B2 | 12/2008 | Hejna, Jr. |
| 7,502,733 B2 | 3/2009 | Andrsen et al. |

(56) References Cited

U.S. PATENT DOCUMENTS

| | | |
|---|---|---|
| 7,505,480 B1 | 3/2009 | Zhang et al. |
| 7,565,681 B2 | 7/2009 | Ngo et al. |
| 7,647,614 B2 | 1/2010 | Krikorian et al. |
| 7,702,952 B2 | 4/2010 | Tarra et al. |
| 7,707,614 B2 | 4/2010 | Krikorian et al. |
| 7,725,912 B2 | 5/2010 | Margulis |
| 7,769,756 B2 | 8/2010 | Krikorian et al. |
| 7,778,408 B2 | 8/2010 | McCree et al. |
| 7,917,932 B2 | 3/2011 | Krikorian |
| 7,975,062 B2 | 7/2011 | Krikorian et al. |
| 7,992,176 B2 | 8/2011 | Margulis et al. |
| 8,041,988 B2 | 10/2011 | Tarra et al. |
| 8,051,454 B2 | 11/2011 | Krikorian et al. |
| 8,060,609 B2 | 11/2011 | Banger et al. |
| 8,099,755 B2 | 1/2012 | Bajpai et al. |
| 8,149,851 B2 | 4/2012 | Asnis et al. |
| 8,169,914 B2 | 5/2012 | Bajpai et al. |
| 8,171,148 B2 | 5/2012 | Lucas et al. |
| 8,266,657 B2 | 9/2012 | Margulis |
| 8,314,893 B2 | 11/2012 | Ravi |
| 8,350,971 B2 | 1/2013 | Malone et al. |
| 2001/0021998 A1 | 9/2001 | Margulis |
| 2002/0004839 A1 | 1/2002 | Wine et al. |
| 2002/0010925 A1 | 1/2002 | Kikinis |
| 2002/0012530 A1 | 1/2002 | Bruls |
| 2002/0031333 A1 | 3/2002 | Mano et al. |
| 2002/0046404 A1 | 4/2002 | Mizutani |
| 2002/0053053 A1 | 5/2002 | Nagai et al. |
| 2002/0080753 A1 | 6/2002 | Lee |
| 2002/0085725 A1 | 7/2002 | Bizjak |
| 2002/0090029 A1 | 7/2002 | Kim |
| 2002/0105529 A1 | 8/2002 | Bowser et al. |
| 2002/0112247 A1 | 8/2002 | Horner et al. |
| 2002/0122137 A1 | 9/2002 | Chen et al. |
| 2002/0131497 A1 | 9/2002 | Jang |
| 2002/0138843 A1 | 9/2002 | Samaan et al. |
| 2002/0143973 A1 | 10/2002 | Price |
| 2002/0147634 A1 | 10/2002 | Jacoby et al. |
| 2002/0147687 A1 | 10/2002 | Breiter et al. |
| 2002/0167458 A1 | 11/2002 | Baudisch et al. |
| 2002/0173864 A1 | 11/2002 | Smith |
| 2002/0188818 A1 | 12/2002 | Nimura et al. |
| 2002/0191575 A1 | 12/2002 | Kalavade et al. |
| 2003/0001880 A1 | 1/2003 | Holtz et al. |
| 2003/0028873 A1 | 2/2003 | Lemmons |
| 2003/0055635 A1 | 3/2003 | Bizjak |
| 2003/0065915 A1 | 4/2003 | Yu et al. |
| 2003/0093260 A1 | 5/2003 | Dagtas et al. |
| 2003/0095791 A1 | 5/2003 | Barton et al. |
| 2003/0115167 A1 | 6/2003 | Sharif |
| 2003/0159143 A1 | 8/2003 | Chan |
| 2003/0187657 A1 | 10/2003 | Erhart et al. |
| 2003/0192054 A1 | 10/2003 | Birks et al. |
| 2003/0208612 A1 | 11/2003 | Harris et al. |
| 2003/0231621 A1 | 12/2003 | Gubbi et al. |
| 2004/0003406 A1 | 1/2004 | Billmaier |
| 2004/0032916 A1 | 2/2004 | Takashima |
| 2004/0052216 A1 | 3/2004 | Roh |
| 2004/0068334 A1 | 4/2004 | Tsai et al. |
| 2004/0083301 A1 | 4/2004 | Murase et al. |
| 2004/0100486 A1 | 5/2004 | Flamini et al. |
| 2004/0103340 A1 | 5/2004 | Sundareson et al. |
| 2004/0139047 A1 | 7/2004 | Rechsteiner et al. |
| 2004/0162845 A1 | 8/2004 | Kim et al. |
| 2004/0162903 A1 | 8/2004 | Oh |
| 2004/0172410 A1 | 9/2004 | Shimojima et al. |
| 2004/0205830 A1 | 10/2004 | Kaneko |
| 2004/0212640 A1 | 10/2004 | Mann et al. |
| 2004/0216173 A1 | 10/2004 | Horoszowski et al. |
| 2004/0236844 A1 | 11/2004 | Kocherlakota |
| 2004/0255249 A1 | 12/2004 | Chang et al. |
| 2005/0021398 A1 | 1/2005 | McCleskey et al. |
| 2005/0021830 A1 | 1/2005 | Urzaiz et al. |
| 2005/0027821 A1 | 2/2005 | Alexander et al. |
| 2005/0038981 A1 | 2/2005 | Connor et al. |
| 2005/0044058 A1 | 2/2005 | Matthews et al. |
| 2005/0050462 A1 | 3/2005 | Whittle et al. |
| 2005/0053356 A1 | 3/2005 | Mate et al. |
| 2005/0055595 A1 | 3/2005 | Frazer et al. |
| 2005/0060759 A1 | 3/2005 | Rowe et al. |
| 2005/0097542 A1 | 5/2005 | Lee |
| 2005/0114852 A1 | 5/2005 | Chen et al. |
| 2005/0132351 A1 | 6/2005 | Randall et al. |
| 2005/0138560 A1 | 6/2005 | Lee et al. |
| 2005/0198584 A1 | 9/2005 | Matthews et al. |
| 2005/0204046 A1 | 9/2005 | Watanabe |
| 2005/0216851 A1 | 9/2005 | Hull et al. |
| 2005/0223087 A1 | 10/2005 | Van Der Stok |
| 2005/0227621 A1 | 10/2005 | Katoh |
| 2005/0229118 A1 | 10/2005 | Chiu et al. |
| 2005/0246369 A1 | 11/2005 | Oreizy et al. |
| 2005/0251833 A1 | 11/2005 | Schedivy |
| 2005/0283791 A1 | 12/2005 | McCarthy et al. |
| 2005/0288999 A1 | 12/2005 | Lerner et al. |
| 2006/0011371 A1 | 1/2006 | Fahey |
| 2006/0031381 A1 | 2/2006 | Van Luijt et al. |
| 2006/0050970 A1 | 3/2006 | Gunatilake |
| 2006/0051055 A1 | 3/2006 | Ohkawa |
| 2006/0095401 A1 | 5/2006 | Krikorian et al. |
| 2006/0095471 A1 | 5/2006 | Krikorian et al. |
| 2006/0095472 A1 | 5/2006 | Krikorian et al. |
| 2006/0095942 A1 | 5/2006 | Van Beek |
| 2006/0095943 A1 | 5/2006 | Demircin et al. |
| 2006/0107226 A1 | 5/2006 | Matthews et al. |
| 2006/0117371 A1 | 6/2006 | Margulis |
| 2006/0146174 A1 | 7/2006 | Hagino |
| 2006/0206581 A1 | 9/2006 | Howarth et al. |
| 2006/0280157 A1 | 12/2006 | Karaoguz et al. |
| 2007/0003224 A1 | 1/2007 | Krikorian et al. |
| 2007/0005783 A1 | 1/2007 | Saint-Hillaire et al. |
| 2007/0022328 A1 | 1/2007 | Tarra et al. |
| 2007/0053446 A1 | 3/2007 | Spilo |
| 2007/0074115 A1 | 3/2007 | Patten et al. |
| 2007/0076604 A1 | 4/2007 | Litwack |
| 2007/0097257 A1 | 5/2007 | El-Maleh et al. |
| 2007/0168543 A1 | 7/2007 | Krikorian et al. |
| 2007/0180485 A1 | 8/2007 | Dua |
| 2007/0198532 A1 | 8/2007 | Krikorian et al. |
| 2007/0234213 A1 | 10/2007 | Krikorian et al. |
| 2007/0286596 A1 | 12/2007 | Lonn |
| 2007/0290876 A1 | 12/2007 | Sato et al. |
| 2007/0300252 A1 | 12/2007 | Acharya et al. |
| 2008/0019276 A1 | 1/2008 | Takatsuji et al. |
| 2008/0037573 A1 | 2/2008 | Cohen |
| 2008/0059533 A1 | 3/2008 | Krikorian |
| 2008/0134267 A1 | 6/2008 | Moghe et al. |
| 2008/0195744 A1 | 8/2008 | Bowra et al. |
| 2008/0199150 A1 | 8/2008 | Candelore |
| 2008/0225176 A1* | 9/2008 | Selby ............... H04N 5/4401 348/572 |
| 2008/0256485 A1 | 10/2008 | Krikorian |
| 2008/0294759 A1 | 11/2008 | Biswas et al. |
| 2008/0307456 A1 | 12/2008 | Beetcher et al. |
| 2008/0307462 A1 | 12/2008 | Beetcher et al. |
| 2008/0307463 A1 | 12/2008 | Beetcher et al. |
| 2009/0074380 A1 | 3/2009 | Boston et al. |
| 2009/0080448 A1 | 3/2009 | Tarra et al. |
| 2009/0157697 A1 | 6/2009 | Rao et al. |
| 2009/0199248 A1 | 8/2009 | Ngo et al. |
| 2009/0252219 A1 | 10/2009 | Chen et al. |
| 2009/0252347 A1* | 10/2009 | Kakkeri ............ H03G 3/3026 381/107 |
| 2009/0281805 A1* | 11/2009 | LeBlanc ........... G10L 21/0208 704/233 |
| 2010/0001960 A1 | 1/2010 | Williams |
| 2010/0005483 A1 | 1/2010 | Rao |
| 2010/0064055 A1 | 3/2010 | Krikorian et al. |
| 2010/0064332 A1 | 3/2010 | Krikorian et al. |
| 2010/0070925 A1 | 3/2010 | Einaudi et al. |
| 2010/0071076 A1 | 3/2010 | Gangotri et al. |
| 2010/0100915 A1 | 4/2010 | Krikorian et al. |
| 2010/0129057 A1 | 5/2010 | Kulkarni |
| 2010/0146527 A1 | 6/2010 | Craib et al. |
| 2010/0192184 A1 | 7/2010 | Margulis et al. |

(56) References Cited

U.S. PATENT DOCUMENTS

| | | |
|---|---|---|
| 2010/0192185 A1 | 7/2010 | Margulis et al. |
| 2010/0192188 A1 | 7/2010 | Rao |
| 2010/0232438 A1 | 9/2010 | Bajpia et al. |
| 2011/0019839 A1 | 1/2011 | Nandury |
| 2011/0032986 A1 | 2/2011 | Banger et al. |
| 2011/0033168 A1 | 2/2011 | Iyer |
| 2011/0035462 A1 | 2/2011 | Akella |
| 2011/0035466 A1 | 2/2011 | Panigrahi |
| 2011/0035467 A1 | 2/2011 | Thiyagarajan et al. |
| 2011/0035668 A1 | 2/2011 | Thiyagarajan |
| 2011/0035669 A1 | 2/2011 | Shirali et al. |
| 2011/0035741 A1 | 2/2011 | Thiyagarajan |
| 2011/0035764 A1 | 2/2011 | Shirali |
| 2011/0055864 A1 | 3/2011 | Shah et al. |
| 2011/0113354 A1 | 5/2011 | Thiyagarajan et al. |
| 2011/0119325 A1 | 5/2011 | Paul et al. |
| 2011/0138435 A1 | 6/2011 | Poli et al. |
| 2011/0150432 A1 | 6/2011 | Paul et al. |
| 2011/0153718 A1 | 6/2011 | Dham et al. |
| 2011/0153845 A1 | 6/2011 | Rao et al. |
| 2011/0158610 A1 | 6/2011 | Paul et al. |
| 2011/0191456 A1 | 8/2011 | Jain |
| 2011/0208506 A1 | 8/2011 | Gurzhi et al. |

FOREIGN PATENT DOCUMENTS

| | | | |
|---|---|---|---|
| DE | 4407319 A1 | | 9/1994 |
| EP | 1443766 A2 | | 8/2004 |
| GB | 2307151 A | | 5/1997 |
| JP | 2003186006 A | | 8/1991 |
| JP | 2008088525 A | | 4/1996 |
| JP | 2000066671 A | | 3/2000 |
| JP | 2003046582 A | | 2/2003 |
| JP | 2003114845 A | | 4/2003 |
| JP | 2006072142 A | | 3/2006 |
| JP | 2006129234 A | | 5/2006 |
| JP | 2008244820 A | | 10/2008 |
| JP | 2008278231 A | | 11/2008 |
| KR | 19990082855 A | | 11/1999 |
| KR | 20010211410 A | | 8/2001 |
| WO | 0133839 A1 | | 5/2001 |
| WO | 0147248 A2 | | 6/2001 |
| WO | 0193161 A1 | | 12/2001 |
| WO | 03052552 A2 | | 6/2003 |
| WO | 2004032511 A1 | | 4/2004 |
| WO | 2006074110 A | | 7/2006 |
| WO | 2006099530 A2 | | 9/2006 |
| WO | 2008024723 A | | 2/2008 |
| WO | 2008048599 A1 | | 4/2008 |
| WO | 2008051347 A2 | | 5/2008 |
| WO | 2008070422 A2 | | 6/2008 |

OTHER PUBLICATIONS

China State Intellectual Property Office, First Office Action mailed Nov. 5, 2013 for Chinese Patent Application No. 201080037093.5.
European Patent Office, Examination Report, dated Apr. 25, 2014 for European Application No. 10737696.4.
Canadian Intellectual Property Office, Office Action, dated Oct. 6, 2014 for Canadian Patent Application No. 2,768,775.
Japanese Office Action issued Apr. 14, 2015 in application No. 2012-521672.
Intellectual Property Office of Singapore "Search and Examination Report" dated Dec. 18, 2013 for Singapore Appln. No. 201200485-9.
International Search Report and Written Opinion, PCT/US2005/020105, Feb. 15, 2007, 6 pages.
International Search Report and Written Opinion for PCT/US2006/04382, mailed Apr. 27, 2007.
Archive of "TV Brick Home Server," www.tvbrick.com, [online] [Archived by http://archive.org on Jun. 3, 2004; Retrieved on Apr. 12, 2006] retrieved from the Internet <URL:http://web.archive.org/web/20041107111024/www.tvbrick.com/en/affi- liate/tvbs/tvbrick/document18/print>.
Faucon, B. "TV 'Brick' Opens up Copyright Can of Worms," Financial Review, Jul. 1, 2003, [online [Retrieved on Apr. 12, 2006] Retrieved from the Internet, URL:http://afr.com/cgi-bin/newtextversions.pl?storyid+1056825330084&3ate+2003/07/01&pagetype+printer§ion+1053801318705&path+articles/2003/06/30/0156825330084.html.].
Balster, Eric J., "Video Compression and Rate Control Methods Based on the Wavelet Transform," The Ohio State University 2004, pp. 1-24.
Kulapala et al., "Comparison of Traffic and Quality Characteristics of Rate-Controlled Wavelet and DCT Video," Arizona State University, Oct. 11, 2004.
Skodras et al., "JPEG2000: The Upcoming Still Image Compression Standard," May 11, 2000, 14 pages.
Taubman et al., "Embedded Block Coding in JPEG2000," Feb. 23, 2001, pp. 1-8 of 36.
Kessler, Gary C., An Overview of TCP/IP Protocols and the Internet; Jan. 16, 2007, retrieved from the Internet on Jun. 12, 2008 at http://www.garykessler.net/library/tcpip.html; originally submitted to the InterNIC and posted on their Gopher site on Aug. 5, 1994.
Roe, Kevin, "Third-Party Observation Under EPC Article 115 on the Patentability of an Invention," Dec. 21, 2007.
Roe, Kevin, Third-Party Submission for Published Application Under CFR §1.99, Mar. 26, 2008.
International Search Report and Written Opinion for International Application No. PCT/US2006/025911, mailed Jan. 3, 2007.
International Search Report for International Application No. PCT/US2007/063599, mailed Dec. 12, 2007.
International Search Report for International Application No. PCT/US2007/076337, mailed Oct. 20, 2008.
International Search Report and Written Opinion for International Application No. PCT/US2006/025912, mailed Jul. 17, 2008.
International Search Report for International Application No. PCT/US2008/059613, mailed Jul. 21, 2008.
International Search Report and Written Opinion for International Application No. PCT/US2008/080910, mailed Feb. 16, 2009.
Wikipedia "Slingbox" [Online], Oct. 21, 2007, XP002512399; retrieved from the Internet: <URL:http://en.wikipedia.org/w/index.php?title=Slingbox&oldid=166080570>; retrieved on Jan. 28, 2009.
Wikipedia "LocationFree Player" [Online], Sep. 22, 2007, XP002512400; retrieved from the Internet: <URL: http://en.wikipedia.org/w/index.php?title=LocationFree_Player&oldid=159683564>; retrieved on Jan. 28, 2009.
Capable Networks LLC "Keyspan Remote Control—Controlling Your Computer With a Remote" [Online], Feb. 21, 2006, XP002512495; retrieved from the Internet: <URL:http://www.slingcommunity.com/article/11791/Keyspan-Remote-Control---Controlling-Your-Computer-With-a-Remot-?highlight=remote+control>; retrieved on Jan. 28, 2009.
Sling Media Inc. "Slingbox User Guide" [Online] 2006, XP002512553; retrieved from the Internet: <URL:http://www.slingmedia.hk/attach/en-US_Slingbox_User_Guide_v12.pdf>; retrieved on Jan. 29, 2009.
Sony Corporation "LocationFree TV" [Online], 2004, SP002512410; retrieved from the Internet: <URL:http://www.docs.sony.com/release/LFX1_X5revision.pdf>; retrieved on Jan. 28, 2009 [note—document uploaded in two parts as file exceeds the 25MB size limit].
Sony Corporation "LocationFree Player Pak—LocationFree Base Station—LocationFree Player" [Online] 2005, XP002512401; retrieved from the Internet: <URL:http://www.docs.sony.com/release/LFPK1.pdf>; retrieved on Jan. 28, 2009.
European Patent Office, European Search Report for European Application No. EP 08 16 7880, mailed Mar. 4, 2009.
Mythtv Wiki, "MythTV User Manual" [Online], Aug. 27, 2007, XP002515046; retrieved from the Internet: <URL: http://www.mythtv.org/wiki?title=User_Manual:Introduction&oldid=25549>.
International Searching Authority, Written Opinion and International Search Report for International Application No. PCT/US2008/077733, mailed Mar. 18, 2009.

(56) References Cited

OTHER PUBLICATIONS

International Searching Authority, Written Opinion and International Search Report for International Application No. PCT/US2008/087005, mailed Mar. 20, 2009.
Watanabe Y. et al., "Multimedia Database System for TV Newscasts and Newspapers"; Lecture Notes in Computer Science, Springer Verlag, Berlin, Germany; vol. 1554, Nov. 1, 1998, pp. 208-220, XP002402824, ISSN: 0302-9743.
Yasuhiko Watanabe et al., "Aligning Articles in TV Newscasts and Newspapers"; Proceedings of the International Conference on Computationallinguistics, XX, XX, Jan. 1, 1998, pp. 1381-1387, XP002402825.
Sodergard C. et al., "Integrated Multimedia Publishing: Combining TV and Newspaper Content on Personal Channels"; Computer Networks, Elsevier Science Publishers B.V., Amsterdam, Netherlands; vol. 31, No. 11-16, May 17, 1999, pp. 1111-1128, XP004304543, ISSN: 1389-1286.
Ariki Y. et al., "Automatic Classification of TV News Articles Based on Telop Character Recognition"; Multimedia Computing and Systems, 1999; IEEE International Conference on Florence, Italy, Jun. 7-11, 1999, Los Alamitos, California, USA, IEEE Comput. Soc. US; vol. 2, Jun. 7, 1999, pp. 148-152, XP010519373, ISBN: 978-0-7695-0253-3; abstract, paragraph [03.1], paragraph [052], figures 1,2.
Sonic Blue "ReplayTV 5000 User's Guide," 2002, entire document.
Microsoft Corporation; Harman/Kardon "Master Your Universe" 1999.
Matsushita Electric Corporation of America MicroCast : Wireless PC Multimedia Transceiver System, Nov. 1998.
"Wireless Local Area Networks: Issues in Technology and Standards" Jan. 6, 1999.
China State Intellectual Property Office "First Office Action," issued Jul. 31, 2009, for Application No. 200580026825.X.
European Patent Office, European Search Report, mailed Sep. 28, 2009 for European Application No. EP 06 78 6175.
European Patent Office, International Searching Authority, "International Search Report," for International Application No. PCT/US2009/049006, mailed Sep. 11, 2009.
International Search Report for PCT/US2008/069914 mailed Dec. 19, 2008.
PCT Partial International Search, PCT/US2009/054893, mailed Dec. 23, 2009.
Newton's Telecom Dictionary, 21st ed., Mar. 2005.
Ditze M. et all "Resource Adaptation for Audio-Visual Devices in the UPnP QoS Architecture," Advanced Networking and Applications, 2006; AINA, 2006; 20% H International conference on Vienna, Austria Apr. 18-20, 2006.
Joonbok, Lee et al. "Compressed High Definition Television (HDTV) Over IPv6," Applications and the Internet Workshops, 2006; Saint Workshops, 2006; International Symposium, Phoenix, AZ, USA, Jan. 23-27, 2006.
Lowekamp, B. et al. "A Hierarchy of Network Performance Characteristics for Grid Applications and Services," GGF Network Measurements Working Group, pp. 1-29, May 24, 2004.
Meyer, Derrick "MyReplayTV™ Creates First-Ever Online Portal to Personal TI! Service; Gives Viewers Whole New Way to Interact With Programming," http://web.archive.org/web/20000815052751/http://www.myreplaytv.com/, Aug. 15, 2000.
Sling Media "Sling Media Unveils Top-of-Line Slingbox PRO-HD" [online], Jan. 4, 2008, XP002560049; retrieved from the Internet: URL:www.slingmedia.com/get/pr-slingbox-pro-hd.html; retrieved on Oct. 12, 2009.
Srisuresh, P. et al. "Traditional IP Network Address Translator (Traditional NAT)," Network Working Group, The Internet Society, Jan. 2001.
China State Intellectual Property Office "First Office Action," issued Jan. 8, 2010, for Application No. 200810126554.0.
Australian Government "Office Action," Australian Patent Application No. 2006240518, mailed Nov. 12, 2009.
Newton's Telcom Dictionary, 20th ed., Mar. 2004.
"The Authoritative Dictionary of IEEE Standard Terms," 7th ed. 2000.
European Patent Office, International Searching Authority, "International Search Report," mailed Mar. 30, 2010; International Application PCT/US2009/068468 filed Dec. 27, 2009.
Qiong, Liu et al. "Digital Rights Management for Content Distribution," Proceedings of the Australasian Information Security Workshop Conference on ACSW Frontiers 2003, vol. 21, 2003, XP002571073, Adelaide, Australia, ISSN: 1445-1336, ISBN: 1-920682-00-7, sections 2 and 2.1.1.
China State Intellectual Property Office "Office Action" issued Mar. 18, 2010 for Application No. 200680022520.6.
China State Intellectual Property Office "Office Action" issued Apr. 13, 2010 for Application No. 200580026825.X.
Canadian Intellectual Property Office "Office Action" mailed Feb. 18, 2010 for Application No. 2569610.
European Patent Office "European Search Report," mailed May 7, 2010 for Application No. 06786174.0.
European Patent Office, International Searching Authority, "International Search Report and Written Opinion," mailed Jun. 4, 2010 for International Application No. PCT/IN2009/000728, filed Dec. 18, 2009.
Lee, M. et al. "Video Frame Rate Control for Non-Guaranteed Network Services with Explicit Rate Feedback," Globecom'00, 2000 IEEE Global Telecommunications conference, San Francisco, CA, Nov. 27-Dec. 1, 2000; [IEEE Global Telecommunications Conference], New York, NY; IEEE, US, vol. 1, Nov. 27, 2000, pp. 293-297, XP001195580; ISBN: 978-0-7803-6452-3, lines 15-20 of sec. II on p. 293, fig. 1.
Korean Intellectual Property Office "Official Notice of Preliminary Rejection," issued Jun. 18, 2010; Korean Patent Application No. 10-2008-7021254.
Japan Patent Office "Notice of Grounds for Rejection (Office Action)," mailed May 25, 2010; Patent Application No. 2007-0268269.
Japan Patent Office "Notice of Grounds for Rejection (Office Action)," mailed May 25, 2010; Patent Application No. 2007-527683.
European Patent Office, International Searchnig Authority, "International Search Report" mailed Sep. 7, 2010; International Application No. PCT/US2010/041680, filed Jul. 12, 2010.
USPTO "Non-Final Office Action" mailed Jan. 25, 2012 for U.S. Appl. No. 12/507,971, filed Jul. 23, 2009.
USPTO "Non-Final Office Action" mailed Aug. 1, 2012 for U.S. Appl. No. 12/507,971, filed Jul. 23, 2009.
USPTO "Notice of Allowance" mailed Nov. 26, 2012 for U.S. Appl. No. 12/507,971, filed Jul. 23, 2009.

* cited by examiner

__US 9,491,538 B2__

ADAPTIVE GAIN CONTROL FOR DIGITAL AUDIO SAMPLES IN A MEDIA STREAM

CROSS-REFERENCE TO RELATED APPLICATION

This application is a divisional of U.S. patent application Ser. No. 12/507,971, filed Jul. 23, 2009, and issued on Mar. 26, 2013 as U.S. Pat. No. 8,406,431.

TECHNICAL FIELD

Embodiments of the subject matter described herein relate generally to the processing of digital audio samples in a media stream. More particularly, embodiments of the subject matter relate to digitally adjusting gain of digital audio samples in a media stream such that the perceived volume is normalized during presentation.

BACKGROUND

Recently, consumers have expressed significant interest in "place-shifting" devices that allow viewing of television or other media content at locations other than their primary media presentation device. Place-shifting devices typically packetize media content that can be transmitted over a local or wide area network to a portable computer, mobile phone, personal digital assistant, remote television or other remote device capable of playing back the packetized media stream for the viewer. Place-shifting therefore allows consumers to view their media content from remote locations such as other rooms, hotels, offices, and/or any other locations where portable media player devices can gain access to a wireless or other communications network.

While place-shifting does greatly improve the convenience afforded to the end user, there remain some challenges related to the manner in which different media streams are presented at the end device. For instance, the digital audio samples in one media stream may be associated with a baseline or average presentation loudness or volume, while the digital audio samples in another media stream may be associated with a different baseline/average presentation loudness or volume. Thus, if the user switches between different media streams the perceived loudness may be inconsistent, and the user will therefore need to adjust the volume control on the presentation device.

Volume normalization techniques can be utilized to automatically adjust the volume perceived by the user. Some volume normalization techniques operate in the analog domain, and others operate in the digital domain. Digital volume normalization techniques are best suited for place-shifting applications because the media streams are encoded and transmitted to the presentation device using data packets. Unfortunately, existing digital volume normalization techniques tend to be ineffective and/or they introduce audible artifacts that can be distracting to the user.

BRIEF SUMMARY

An adaptive gain control method for digital audio samples is provided. The method begins by initializing processing of a media stream. The method continues by adjusting gain of a first set of digital audio samples in the media stream using a fast gain adaptation scheme, resulting in a first group of gain-adjusted digital audio samples having normalized volume during presentation. Thereafter, the method adjusts gain of a second set of digital audio samples in the media stream using a steady state gain adaptation scheme that is different than the fast gain adaptation scheme, resulting in a second group of gain-adjusted digital audio samples having normalized volume during presentation.

Also provided is a computer program product, which is tangibly embodied in a computer-readable medium. The computer program product is operable to cause a digital media processing device to perform operations for a media stream. These operations include: calculating a loudness estimate for a current block of digital audio samples in the media stream; calculating a reference gain value for the current block of digital audio samples, the reference gain value being influenced by the loudness estimate; calculating a maximum gain value for the current block of digital audio samples; calculating an estimated gain value for the current block of digital audio samples, the estimated gain value being influenced by the reference gain value and the maximum gain value; and calculating a gain value for the current block of digital audio samples, the gain value being influenced by the estimated gain value, the maximum gain value, and a previous gain value for a previous block of digital audio samples in the media stream. The computer program product is also operable to cause the digital media processing device to modify the current block of digital audio samples by applying the gain value to the digital audio samples in the current block of digital audio samples. In certain embodiments the maximum gain value is influenced by dynamic range of the current block of digital audio samples.

A system for processing digital audio samples in a media stream is also provided. The system includes a first means for adjusting gain of a first block of digital audio samples in the media stream using a fast gain adaptation scheme, resulting in a first block of gain-adjusted digital audio samples. The system also includes a second means for adjusting gain of a second block of digital audio samples in the media stream using a steady state gain adaptation scheme that is different than the fast gain adaptation scheme, resulting in a second block of gain-adjusted digital audio samples. The system also includes means for transmitting gain-adjusted digital audio samples to a remotely-located media player.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
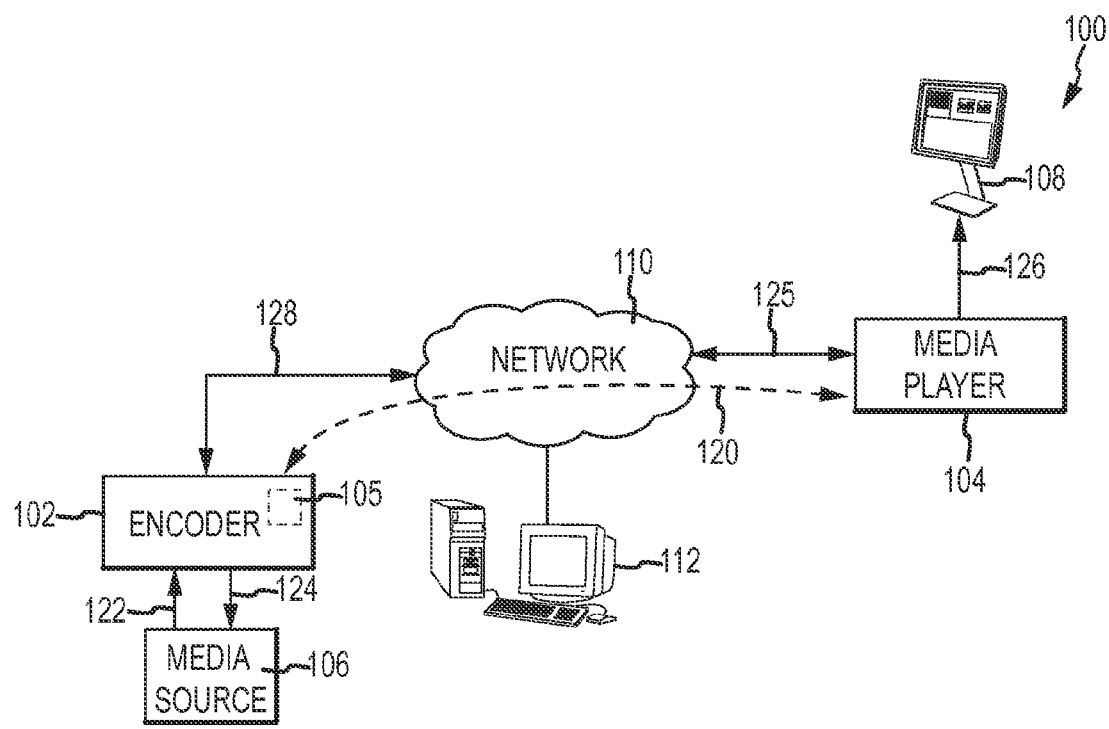
FIG. 1 is a schematic representation of an embodiment of a media presentation system.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

Techniques and technologies may be described herein in terms of functional and/or logical block components, and with reference to symbolic representations of operations, processing tasks, and functions that may be performed by various computing components or devices. Such operations, tasks, and functions are sometimes referred to as being computer-executed, computerized, software-implemented, or computer-implemented. In practice, one or more processor devices can carry out the described operations, tasks, and functions by manipulating electrical signals representing data bits at memory locations in the system memory, as well as other processing of signals. The memory locations where data bits are maintained are physical locations that have particular electrical, magnetic, optical, or organic properties corresponding to the data bits. It should be appreciated that the various block components shown in the figures may be realized by any number of hardware, software, and/or firmware components configured to perform the specified functions. For example, an embodiment of a system or a component may employ various integrated circuit components, e.g., memory elements, digital signal processing elements, logic elements, look-up tables, or the like, which may carry out a variety of functions under the control of one or more microprocessors or other control devices.

When implemented in software or firmware, various elements of the systems described herein are essentially the code segments or instructions that perform the various tasks. The program or code segments can be stored in a processor-readable medium or transmitted by a computer data signal embodied in a carrier wave over a transmission medium or communication path. The "processor-readable medium" or "machine-readable medium" may include any medium that can store or transfer information. Examples of the processor-readable medium include an electronic circuit, a semiconductor memory device, a ROM, a flash memory, an erasable ROM (EROM), a floppy diskette, a CD-ROM, an optical disk, a hard disk, or the like. The computer data signal may include any signal that can propagate over a transmission medium such as electronic network channels, optical fibers, air, electromagnetic paths, or RF links. The code segments may be downloaded via computer networks such as the Internet, an intranet, a LAN, or the like.

According to various embodiments, the perceived presentation loudness (i.e., volume) of a media stream is normalized or leveled relative to a reference loudness, such that different media streams are presented at about the same average loudness for a constant volume setting at the presentation device. The volume normalization scheme is carried out in the digital domain by modifying, adjusting, or otherwise altering the digital audio samples associated with the media streams. In certain embodiments, the digital audio samples are modified by a digital media processing device that encodes and transmits media streams (via a data communication network) to the user's media presentation device (e.g., a laptop computer, a cell phone, a remote set-top box, or the like). The digitally normalized audio samples are transmitted to the presentation device in the desired media stream, resulting in normalized presentation volume for different media streams. Notably, the presentation device itself need not be modified to support the digital volume normalization techniques described here because the digital audio samples arrive at the presentation device after application of digital gain adjustment.

Turning now to the figures and with initial reference to FIG. 1, an exemplary embodiment of a media presentation system 100 can be utilized to carry out place-shifting of digital media content that includes digital audio samples. This particular embodiment of the system 100 includes a digital media processing device (e.g., a place-shifting encoder system 102) that receives media content 122 from a content source 106, encodes the received content into a streaming format, and then transmits the encoded media stream 120 to a remotely-located digital media player (or other presentation device) 104 over a network 110. The media player 104 receives the encoded media stream 120, decodes the stream, and presents the decoded content to a viewer on a television or other display 108. Although not depicted in FIG. 1, the media player 104 includes or cooperates with at least one speaker, audio transducer, or other sound-generating element that supports the presentation of the audio portion of media streams. In various embodiments, a server 112 may also be provided to communicate with the encoder system 102 and/or the media player 104 via the network 110 to assist these devices in locating each other, maintaining security, providing or receiving content or information, and/or any other features as desired. This feature is not required in all embodiments, however, and the concepts described herein may be deployed in any data streaming application or environment, including place-shifting but also any other media or other data streaming situation.

The encoder system 102 is any component, hardware, software logic and/or the like capable of transmitting a packetized stream of media content over the network 110. In various embodiments, the encoder system 102 incorporates suitable encoder and/or transcoder (collectively "encoder") logic to convert audio/video or other media content 122 into a packetized format that can be transmitted over the network 110. The media content 122 may be received in any format, and may be received from any internal or external content source 106 such as any sort of broadcast, cable or satellite television programming source, a "video-on-demand" or similar source, a digital video disk (DVD) or other removable media, a video camera, and/or the like. The encoder system 102 encodes the media content 122 to create the encoded media stream 120 in any manner. In various embodiments, the encoder system 102 contains a transmit buffer 105 that temporarily stores encoded data prior to transmission on the network 110.

In practice, an embodiment of the encoder system 102 may be implemented using any of the various SLINGBOX products available from Sling Media of Foster City, Calif., although other products could be used in other embodiments. Certain embodiments of the encoder system 102 are generally capable of receiving the media content 122 from an external content source 106 such as any sort of digital video recorder (DVR), set top box (STB), cable or satellite programming source, DVD player, and/or the like. In such embodiments, the encoder system 102 may additionally provide commands 124 to the content source 106 to produce the desired media content 122. Such commands 124 may be provided over any sort of wired or wireless interface, such as an infrared or other wireless transmitter that emulates remote control commands receivable by the content source 106. Other embodiments, however, particularly those that do not involve place-shifting, may modify or omit this feature entirely.

In other embodiments, the encoder system 102 may be integrated with any sort of content-receiving or other capabilities typically affiliated with the content source 106. The encoder system 102 may be a hybrid STB or other receiver, for example, that also provides transcoding and place-shifting features. Such a device may receive satellite, cable, broadcast and/or other signals that encode television programming or other content received from an antenna, modem, server and/or other source. A receiver of the encoder system 102 may further demodulate or otherwise decode the received signals to extract programming that can be locally viewed and/or place-shifted to the remotely-located media player 104 as appropriate. In this regard, the encoder system 102 may also include a content database stored on a hard disk drive, memory, or other storage medium to support a personal or digital video recorder (DVR) feature or other content library as appropriate. Hence, in some embodiments, the content source 106 and the encoder system 102 may be physically and/or logically contained within a common component, housing or chassis.

In still other embodiments, the encoder system 102 includes or is implemented as a software program, applet, or the like executing on a conventional computing system (e.g., a personal computer). In such embodiments, the encoder system 102 may encode, for example, some or all of a screen display typically provided to a user of the computing system for place-shifting to a remote location. One device capable of providing such functionality is the SlingProjector product available from Sling Media of Foster City, Calif., which executes on a conventional personal computer, although other products could be used as well.

The media player 104 is any device, component, module, hardware, software and/or the like capable of receiving the encoded media stream 120 from one or more encoder systems 102. In various embodiments, the media player 104 is personal computer (e.g., a "laptop" or similarly portable computer, although desktop-type computers could also be used), a mobile phone, a personal digital assistant, a personal media player, or the like. In many embodiments, the media player 104 is a general purpose computing device that includes a media player application in software or firmware that is capable of securely connecting to the encoder system 102, and is capable of receiving and presenting media content to the user of the device as appropriate. In other embodiments, however, the media player 104 is a standalone or other separate hardware device capable of receiving the encoded media stream 120 via any portion of the network 110 and decoding the encoded media stream 120 to provide an output signal 126 that is presented on the display 108. One example of a standalone media player 104 is the SLINGCATCHER product available from Sling Media of Foster City, Calif., although other products could be equivalently used.

The network 110 is any digital or other communications network capable of transmitting messages between senders (e.g., the encoder system 102) and receivers (e.g., the media player 104). In various embodiments, the network 110 includes any number of public or private data connections, links or networks supporting any number of communications protocols. The network 110 may include the Internet, for example, or any other network based upon TCP/IP or other conventional protocols. In various embodiments, the network 110 also incorporates a wireless and/or wired telephone network, such as a cellular communications network for communicating with mobile phones, personal digital assistants, and/or the like. The network 110 may also incorporate any sort of wireless or wired local area networks, such as one or more IEEE 802.3 and/or IEEE 802.11 networks.

The encoder system 102 and/or the media player 104 are therefore able to communicate in any manner with the network 110 (e.g., using any sort of data connections 128 and/or 125, respectively). Such communication may take place over a wide area link that includes the Internet and/or a telephone network, for example; in other embodiments, communications between the encoder system 102 and the media player 104 may take place over one or more wired or wireless local area links that are conceptually incorporated within the network 110. In various equivalent embodiments, the encoder system 102 and the media player 104 may be directly connected via any sort of cable (e.g., an Ethernet cable or the like) with little or no other network functionality provided.

Many different place-shifting scenarios could be formulated based upon available computing and communications resources, consumer demand and/or any other factors. In various embodiments, consumers may wish to place-shift content within a home, office or other structure, such as from the encoder system 102 to a desktop or portable computer located in another room. In such embodiments, the content stream will typically be provided over a wired or wireless local area network operating within the structure. In other embodiments, consumers may wish to place-shift content over a broadband or similar network connection from a primary location to a computer or other remote media player 104 located in a second home, office, hotel or other remote location. In still other embodiments, consumers may wish to place-shift content to a mobile phone, personal digital assistant, media player, video game player, automotive or other vehicle media player, and/or other device via a mobile link (e.g., a GSM/EDGE or CDMA/EVDO connection, any sort of 3G or subsequent telephone link, an IEEE 802.11 "Wi-Fi" link, and/or the like). Several examples of place-shifting applications available for various platforms are provided by Sling Media of Foster City, Calif., although the concepts described herein could be used in conjunction with products and services available from any source.

Figure 2:
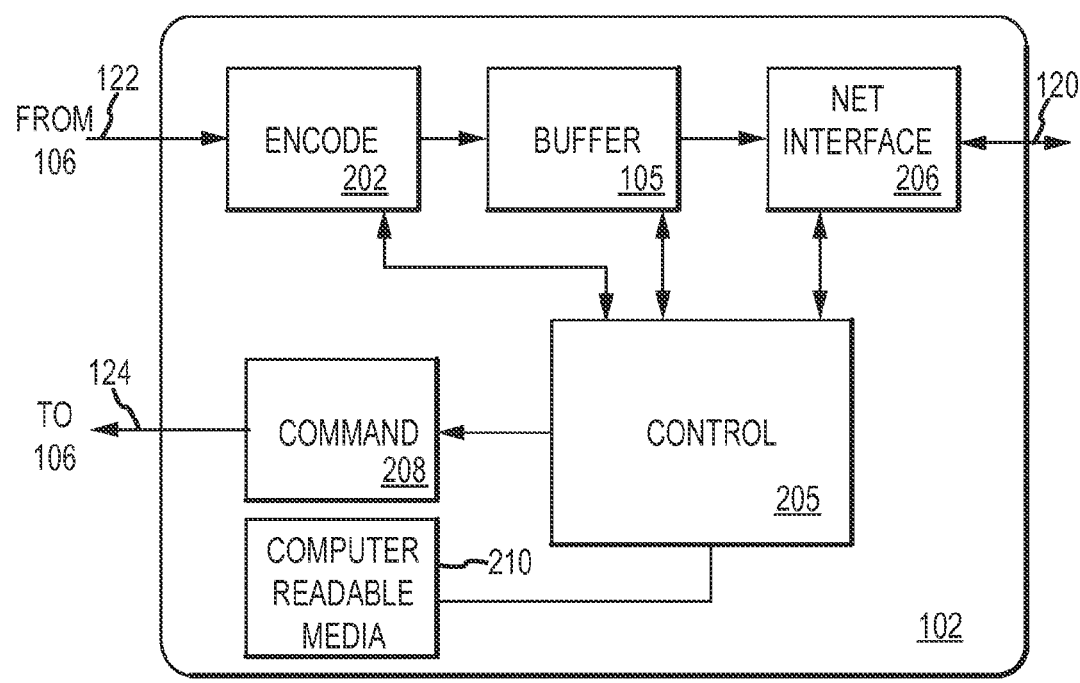
FIG. 2 is a schematic representation of an embodiment of a digital media processing device.

FIG. 2 is a schematic representation of an embodiment of a digital media processing device, such as the encoder system 102. Again, the encoder system 102 generally creates an encoded media stream 120 that is routable on the network 110 based upon the media content 122 received from the content source 106. In this regard, and with reference now to FIG. 2, the encoder system 102 typically includes an encoding module 202, a transmit buffer 105, and a network interface 206 in conjunction with appropriate control logic, which may be associated with a control module 205. In operation, the encoding module 202 typically receives the media content 122 from the internal or external content source 106, encodes the data into the desired format for the encoded media stream 120, and stores the encoded data in the transmit buffer 105. The network interface 206 then retrieves the formatted data from the transmit buffer 105 for transmission on the network 110. The control module 205 suitably monitors and controls the encoding and network transmit processes carried out by the encoding module 202 and the network interface 206, respectively, and may perform other functions as well. The encoder system 102 may also have a command module 208 or other feature capable of generating and providing the commands 124 to the content source 106, as described above.

As noted above, creating the encoded media stream 120 typically involves encoding and/or transcoding the media content 122 received from the content source 106 into a suitable digital format that can be transmitted on the network 110. Generally, the encoded media stream 120 is placed into a standard or other known format (e.g., the WINDOWS MEDIA format available from the Microsoft Corporation of Redmond, Wash., the QUICKTIME format, the REAL-PLAYER format, an MPEG format, and/or the like) that can be transmitted on the network 110. This encoding may take place, for example, in any sort of encoding module 202 as appropriate. The encoding module 202 may be any sort of hardware (e.g., a digital signal processor or other integrated circuit used for media encoding), software (e.g., software or firmware programming used for media encoding that executes at the encoder system 102), or the like. The encoding module 202 is therefore any feature that receives the media content 122 from content source 106 (e.g., via any sort of hardware and/or software interface) and encodes or transcodes the received data into the desired format for transmission on the network 110. Although FIG. 2 shows a single encoding module 202, in practice the encoder system 102 may include any number of encoding modules 202. Different encoding modules 202 may be selected based upon the type of media player 104, network conditions, user preferences, and/or the like.

In various embodiments, the encoding module 202 may also apply other modifications, transforms, and/or filters to the received content before or during the encoding/transcoding process. Video signals, for example, may be resized, cropped and/or skewed. Similarly, the color, hue and/or saturation of the signal may be altered, and/or noise reduction or other filtering may be applied. Digital rights management encoding and/or decoding may also be applied in some embodiments, and/or other features may be applied as desired. Audio signals may be modified by adjusting sampling rate, mono/stereo parameters, noise reduction, multi-channel sound parameters and/or the like. In this regard, digital audio samples in a media stream can be modified in accordance with the adaptive digital gain control techniques and methodologies described in more detail below. Such gain control techniques can be used to modify blocks of digital audio samples to normalize the volume or loudness perceived by the user during presentation of the media stream.

The network interface 206 refers to any hardware, software and/or firmware that allows the encoder system 102 to communicate on the network 110. In various embodiments, the network interface 206 includes suitable network stack programming and other features and/or conventional network interface (NIC) hardware such as any wired or wireless interface as desired.

In various embodiments, the control module 205 monitors and controls the encoding and transmit processes performed by the encoding module 202 and the network interface 206, respectively. To that end, the control module 205 is any hardware, software, firmware or combination thereof capable of performing such features. In various embodiments, the control module 205 further processes commands received from the remote media player via the network interface 206 (e.g., by sending the commands 124 to the content source 106 via the command module 208 or the like). The control module 205 may also transmit commands to the media player 104 via the network interface 206 and/or may control or otherwise effect any other operations of the encoder system 102. In various embodiments, the control module 205 implements the control features used to monitor and adjust the operation of the encoding module 202 and/or the network interface 206 to efficiently provide the media stream to the media player 104.

Certain embodiments of the encoding module 202 may include or execute one or more computer programs (e.g., software) that are tangibly embodied in appropriately configured computer-readable media 210. The computer program product is operable to cause the encoder system 102 to perform certain operations on media streams, as described in more detail below with reference to FIG. 3 and FIG. 4. For this embodiment, FIG. 2 depicts the computer-readable media 210 associated with the control module 205, although such an association need not be employed in all implementations. Indeed, the computer-readable media 210 may alternatively (or additionally) be utilized in connection with the encoding module 202 if so desired. As mentioned above, the computer-readable media 210 may include, without limitation: an electronic circuit, a semiconductor memory device, a ROM, a flash memory, an erasable ROM (EROM), a floppy diskette, a CD-ROM, an optical disk, a hard disk, or the like.

Figure 3:
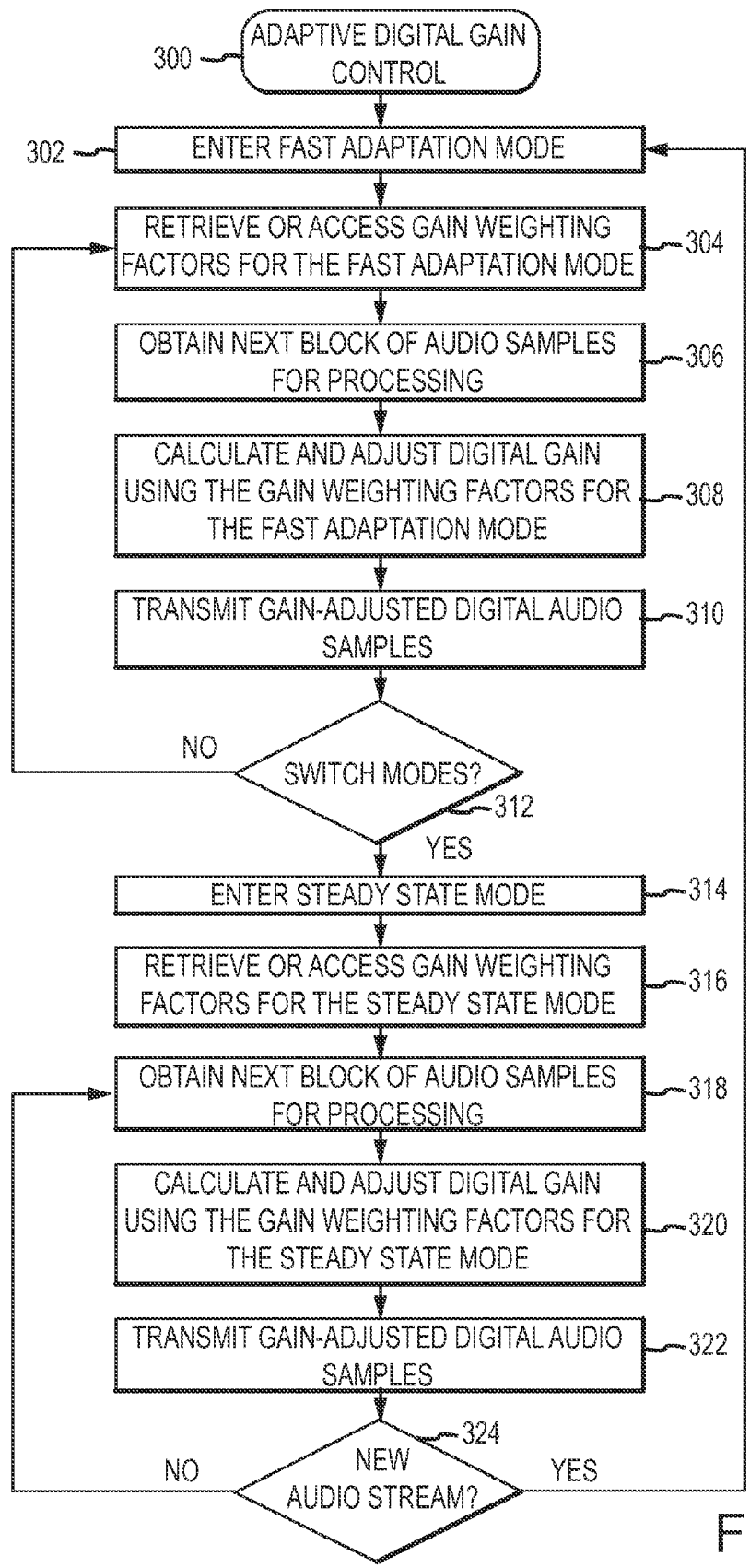
FIG. 3 is a flow chart that illustrates an embodiment of an adaptive digital gain control process.
Figure 4:
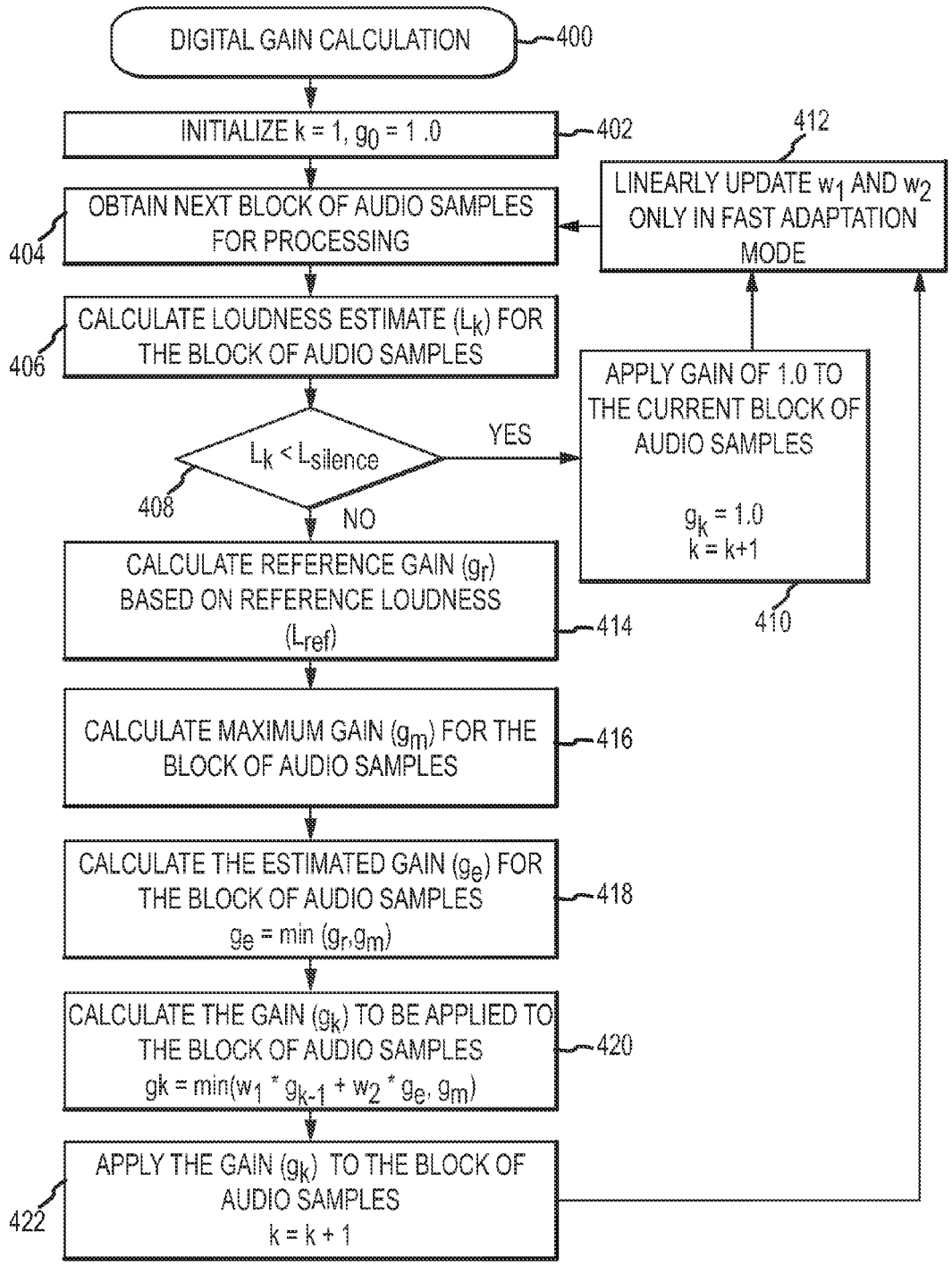
FIG. 4 is a flow chart that illustrates an embodiment of a digital gain calculation process.

FIG. 3 is a flow chart that illustrates an embodiment of an adaptive digital gain control process 300, and FIG. 4 is a flow chart that illustrates an embodiment of a digital gain calculation process 400. The various tasks performed in connection with an illustrated process may be performed by software, hardware, firmware, or any combination thereof. The operations and instructions associated with a described process may be executed by any processor and/or other processing features within the encoder system 102, and the particular means used to implement each of the various functions shown in the figures, then, could be any sort of processing hardware (such as the control module 205 of FIG. 2) executing software or processor-based logic in any format. It should be appreciated that a described process may include any number of additional or alternative tasks, or may omit one or more illustrated tasks. Moreover, the tasks shown in the figures need not be performed in the illustrated order, and a described process may be incorporated into a more comprehensive procedure or process having additional functionality not described in detail herein.

Referring now to FIG. 3, the adaptive digital gain control process 300 can be started when a new media stream has been designated for encoding and delivery to a presentation device. A media stream may include or otherwise be associated with a plurality of digital audio samples. As used here, a digital audio sample corresponds to a digital representation of an analog audio signal taken at a point in time (or over a relatively short period of time), as is well understood. The magnitude of the analog audio signal is converted into a digital representation, and the digital audio sample includes a number of bits that conveys that digital representation. In certain embodiments, one digital audio sample is represented by sixteen bits (although the number of bits in practice may be more or less than sixteen if so desired). In accordance with some embodiments, the sampling rate for digital audio samples is within the range of about 16,000 to 48,000 samples per second, and certain embodiments utilize a sampling rate of 32,000 samples per second.

As used here, a "block" of samples refers to a set, group, or other collection of samples contained in a media stream. The number of samples in a block can be arbitrarily defined, or the number may be selected for compatibility with certain data communication standards, streaming media standards, hardware requirements, and/or software requirements. In certain embodiments, one block of digital audio samples is represented by 1024 consecutive samples (although the number of samples per block may be more or less than 1024 if so desired). Consequently, for a sampling rate of 32,000 samples per second, one block of digital audio samples represents about 32 ms of time.

The process 300 is able to respond in a real-time and dynamic manner to accommodate different media streams (the end user may switch from one media stream to another for presentation at the media player). In this regard, the process 300 begins by initializing processing of a media stream and entering a fast adaptation mode (task 302). The fast adaptation mode represents an initial training or learning period for the gain control technique described herein. In practice, the fast adaptation mode quickly adjusts the gain of the initial digital audio samples in the media stream so that the volume perceived by the user can be normalized (if needed) by at least some amount. Thereafter, the encoder system can transition to a steady state mode during which the gain control is adjusted in a more accurate and controlled manner.

For processing of digital audio samples during the fast adaptation mode, the encoder system utilizes a designated set of weighting factors; these weighting factors are used to calculate the gain to be applied to blocks of digital audio samples. The weighting factors control the extent to which the gain applied to adjacent blocks of digital audio samples can differ. The weighting factors and exemplary gain calculation methodologies are described in more detail below with reference to FIG. 4. In practice, the weighting factors are empirically determined values that are accessible by the encoder system. Although any number of weighting factors could be used, this particular embodiment uses two weighting factors, which are labeled $w_1$ and $w_2$ herein. Moreover, the values of $w_1$ and $w_2$ are variable for the fast gain adaptation scheme, and the values of $w_1$ and $w_2$ are fixed for the steady state gain adaptation scheme. For the embodiment described here, $w_1$ and $w_2$ are positive and satisfy the relationship $w_1+w_2=1.0$ in both fast adaptation and steady state modes of operation.

In certain situations, the value of $w_1$ for the fast adaptation mode is less than or equal to the value of $w_1$ for the steady state mode, and the value of $w_2$ for the fast adaptation mode is greater than or equal to the value of $w_2$ for the steady state mode. In certain situations, $w_1>w_2$ for both the fast adaptation mode and the steady state mode. In certain situations, the difference $w_1-w_2$ for the fast adaptation mode is less than the difference $w_1-w_2$ for the steady state mode. As one specific non-limiting example, in the fast adaptation mode, $w_1=0.7$ and $w_2=0.3$, and in the steady state mode, $w_1=0.9$ and $w_2=0.1$.

For certain embodiments, the value of $w_1$ in the fast adaptation mode is always less than the value of $w_1$ in the steady state mode (although at the transition between modes the value might be the same), the value of $w_2$ in the fast adaptation mode is always greater than the value of $w_2$ in the steady state mode (although at the transition between modes the value might be the same), and the value of $w_1$ is always greater than the value of $w_2$ (for both modes). Moreover, the values of $w_1$ and $w_2$ need not remain constant during the fast adaptation mode. Indeed, these values can be adjusted during the fast adaptation mode to arrive at the values to be used during the steady state mode. In a typical implementation, $w_1$ increases linearly from one value (for example, 0.7) to another value (for example, 0.9), and $w_2$ decreases linearly from one value (for example, 0.3) to another value (for example, 0.1) during the fast adaptation mode.

For example, suppose that the process 300 remains in the fast adaptation mode for a hundred blocks of audio samples. When the process 300 enters the fast adaptation mode, the values of $w_1$ and $w_2$ are initialized to 0.7 and 0.3, respectively. After the gain adjustment of the first block of audio samples, $w_1$ is increased by $$\frac{0.9 - .07}{100}$$

and $w_2$ is decreased by $$\frac{0.3 - 0.1}{100}.$$

This modification of $w_1$ and $w_2$ happens after gain adjustment of each block of digital audio samples as long as the process 300 remains in the fast adaptation mode. By the time the process 300 reaches the end of the fast adaptation mode, the linear adjustments of $w_1$ and $w_2$ result in values of 0.9 and 0.1, respectively. Thereafter, the process 300 enters the steady state mode with these values. In the steady state adaptation mode, $w_1$ and $w_2$ do not undergo any further changes and they remain constant at their respective values (0.9 and 0.1 for this example). Later at some point in time, when the system switches back to the fast adaptation mode, $w_1$ and $w_2$ are again reset to their initial values (0.7 and 0.3 for this example) and linear adjustment occurs as explained above.

Referring back to FIG. 3, the process 300 can compute or access the gain weighting factors for the fast adaptation mode (task 304), and obtain the next block of digital audio samples for processing (task 306) during the fast adaptation mode. The process 300 then continues by calculating a gain value for the current block and adjusting the gain of the digital audio samples in the current block in accordance with the calculated gain value (task 308). Such adjustment or modification of the digital audio samples results in gain-adjusted digital audio samples having normalized volume (loudness) during presentation at the destination media player. During task 308, the gain value for the current block is calculated using the currently applicable weighting factors ($w_1$ and $w_2$) corresponding to the fast adaptation mode. In this regard, the gain of the digital audio samples is adjusted using a fast gain adaptation scheme for as long as the process 300 remains in the fast adaptation mode. For the embodiments described here, the gain value represents a multiplicative gain that is used as a multiplier for the original non-adjusted digital audio sample value. Thus, a gain value of one represents no change and the original digital audio sample value will remain unchanged with a gain value of one.

The process 300 transmits the gain-adjusted digital audio samples to the remotely-located digital media player (task 310) in an ongoing manner. In certain embodiments, task 310 transmits the gain-adjusted digital audio samples in blocks, as is well understood. Moreover, the gain-adjusted digital audio samples will typically be transmitted in a media stream that also includes or otherwise conveys video content. Upon receipt, the media player simply decodes and presents the media stream to the user as usual. The media player need not perform any additional or special processing to implement the volume normalizing technique described here because the digital audio samples received by the media player are already gain-adjusted.

As mentioned previously, the fast adaptation mode is utilized as a brief training or learning period for new media streams. Accordingly, the encoder system may determine, detect, or otherwise be instructed to switch from the fast adaptation mode to the steady state mode (query task 312). If the process 300 detects a mode switching condition, then it can enter the steady state mode (task 314). Otherwise, the process 300 can return to task 304 to compute or access the newly adjusted values of $w_1$ and $w_2$, obtain the next block of audio samples for processing, and continue as described previously. The mode switching condition can be associated with one or any number of appropriate metrics, measures, or parameters. For example, the fast adaptation mode may remain active for a predetermined time period after initializing the processing of the current media stream, for a predetermined time period after the system enters the fast adaptation mode, for a predetermined time period after the weighting factors are computed or retrieved in task 304, etc. In typical implementations, the fast adaptation mode lasts for about four to eight seconds. As another example, the fast adaptation mode may remain active for a predetermined number of blocks (or samples) after initializing the processing of the current media stream, for a predetermined number of blocks (or samples) after the system enters the fast adaptation mode, for a predetermined number of blocks (or samples) after the weighting factors are retrieved in task 304, etc.

Assuming that it is time for the encoder system to switch modes, the process will enter and initiate the steady state mode. The steady state mode represents a "long term" and relatively stable period for the gain control technique described herein. In practice, the steady state mode takes over after the fast adaptation mode has made its initial gain adjustments. During the steady state mode, the gain of the digital audio samples is adjusted in an ongoing and accurate manner so that the volume perceived by the user remains normalized (if needed) relative to the reference volume level.

For the steady state mode, the process 300 retrieves or accesses the gain weighting factors for the steady state mode (task 316), which are different than the gain weighting factors used during the fast adaptation mode. The process 300 also obtains the next block of digital audio samples for processing (task 318) during the steady state mode. The process 300 then continues by calculating the gain value for the current block and adjusting the gain of the digital audio samples in the current block in accordance with the calculated gain value (task 320). During task 320, the gain value for the current block is calculated using the gain weighting factors ($w_1$ and $w_2$) corresponding to the steady state mode. Therefore, the gain of the digital audio samples is adjusted using a steady state gain adaptation scheme for as long as the process 300 remains in the steady state mode, where the steady state gain adaptation scheme is different than the fast gain adaptation scheme. The process 300 transmits the gain-adjusted digital audio samples to the remotely-located digital media player (task 322) as described above for task 310. Again, the media player need not perform any additional or special processing to implement the volume normalizing technique described here because the digital audio samples received by the media player are already gain-adjusted.

As mentioned previously, the process 300 can be repeated for each new media stream. Thus, the encoder system may determine, detect, or otherwise be instructed to switch from the current audio stream to a new audio stream (query task 324). If the process 300 detects a new media or audio stream, then it can initialize the processing of the new media stream and again enter the fast adaptation mode (task 302). Otherwise, the process 300 can return to task 318, obtain the next block of audio samples for processing in the steady state mode, and continue as described previously.

Although the embodiment described here uses two modes (fast adaptation and steady state), an adaptive digital gain control technique could instead employ only one mode, or it could employ more than two different modes. The use of two different modes strikes a good balance between audio quality, effectiveness, and normalization speed.

Referring now to FIG. 4, the digital gain calculation process 400 can be utilized by the encoder system during the adaptive digital gain control process 300. The process 400 is performed during both the fast adaptation mode and the steady state mode (with different values for the weighting factors $w_1$ and $w_2$, as explained previously). The process 400 may begin (task 402) with the first block of digital audio samples (where k indicates the block number), and by obtaining that block of digital audio samples in the media stream for processing (task 404). The process 400 considers the digital audio samples in blocks because a single audio sample conveys no inherent loudness or volume information by itself. For this embodiment, the process 400 calculates a loudness estimate ($L_k$) for the current block of digital audio samples (task 406), where the kth block includes N samples: $\{a_1, a_2, a_3, \ldots a_N\}$. Although other estimating methodologies could be employed, the embodiment described here calculates the loudness estimate in accordance with the expression $$L_k = \sum_{i=1}^{i=N} |a_i|,$$

where $L_k$ is the loudness estimate, $a_i$ represents the digital audio samples, and the current block includes N digital audio samples. The absolute value of each audio sample is taken because any given audio sample may be positive or negative, depending upon its intended sound pressure direction relative to the listener's eardrums. Thus, the process 400 calculates the loudness estimate as a sum of the "magnitudes" of the audio samples contained in the current block.

The calculated loudness estimate can then be compared to a silence threshold value (query task 408). The silence threshold value may be empirically determined and defined such that it is low enough to serve as an accurate threshold and high enough to contemplate bit errors, artifacts, inconsistencies in the original audio data, and "non-zero" audio samples that cannot be detected as sound. If the calculated loudness estimate is less than the silence threshold, then the process 400 can apply a multiplicative gain of one (or any baseline value, which may but need not be approximately equal to one) to the current block of digital audio samples (task 410). In other words, the process 400 assumes that the gain value ($g_k$) for the current block will be equal to one. Thus, if the process 400 determines that the current block represents silence, then there is no need to apply any gain, and the remainder of the process 400 can be bypassed. As explained above with reference to FIG. 3 and the process 300, while operating in the fast adaptation mode, the values of $w_1$ and $w_2$ are linearly updated on a block-by-block basis (task 412). In this regard, task 412 leads back to task 404 so that the process 400 can obtain the next block for processing. If in the steady state mode, then task 412 would be bypassed.

If query task 408 determines that the loudness estimate is not less than the silence threshold, then the process 400 may continue by determining or calculating a reference gain value ($g_r$) that is influenced by the loudness estimate (task 414). More specifically, the reference gain value is based upon the loudness estimate and a reference loudness value. Although other methodologies could be employed, the embodiment described here calculates the reference gain value in accordance with the expression $$g_r = \frac{L_{ref}}{L_k}.$$

where $g_r$ is the reference gain value, and $L_{ref}$ is the reference loudness value. The reference loudness value is a constant value that represents, corresponds to, or otherwise indicates the desired normalized volume. Ideally and theoretically, therefore, gain-adjusted digital audio samples will be characterized by an adjusted loudness that corresponds to the reference loudness value. The reference gain value is used later in the process 400.

The process 400 may also calculate a maximum gain value ($g_m$) for the current block of digital audio samples (task 416). Although other methodologies could be employed, the embodiment described here calculates the maximum gain value in accordance with the expression $$g_m = \frac{2^{n-1}}{a_{max}},$$

where n is the number of bits per digital audio sample, and where $a_{max}$ is the maximum absolute sample value in the current block of digital audio samples. The process 400 determines the maximum allowable gain value for the current block in this manner to prevent bit overflow in the digital audio samples of the block. For example, if the current block includes a digital audio sample that has a relatively high value that approaches the maximum sample value, then very little multiplicative gain can be applied to that sample without causing overflow. On the other hand, if all of the samples in the block have relatively low values, then a higher amount of multiplicative gain can be applied to the block.

This particular embodiment also determines or calculates an estimated gain value ($g_e$) for the current block of digital audio samples (task 418), where the estimated gain value is influenced by the reference gain value and/or by the maximum gain value. More specifically, the estimated gain value is based upon the reference gain value and the maximum gain value. Although other techniques could be employed, the embodiment described here calculates the estimated gain value in accordance with the expression $g_e = \min(g_r, g_m)$, where $g_e$ is the estimated gain value. Thus, the estimated gain value will be equal to either the reference gain value or the maximum gain value, whichever one is lower (or equal to both if they are the same).

Next, the process 400 calculates the gain value ($g_k$) to be applied to the current block of digital audio samples (task 420). Although other methodologies could be employed, the embodiment described here calculates the estimated gain value in accordance with the expression $g_k = \min(w_1 \times g_{k-1} + w_2 \times g_e, g_m)$, where $g_k$ is the computed gain value, and $w_1$ and $w_2$ are the weighting factors, which were described previously. The expression for $g_k$ includes a minimum operator that selects one of two values, whichever is lower (or selects either value if they are both the same). The first value is defined by the term $w_1 \times g_{k-1} + w_2 \times g_e$, and the second value is the maximum gain value ($g_m$). As indicated by this expression, the gain value will be influenced by the estimated gain value, the maximum gain value, and a previous gain value ($g_{k-1}$) for a previous block of digital audio samples in the media stream. For the reasons described above, this computed gain value will also be influenced by the reference gain value calculated during task 414. For this particular embodiment, the gain value for the current block ($g_k$) is determined in response to the gain value for the immediately preceding block ($g_{k-1}$). Alternatively (or additionally), $g_k$ could be calculated by considering other gain values for blocks prior to the immediately preceding block. This reliance on a previous gain value prevents large block-to-block variations in the applied gain. In practice, $g_k$ will have a value that ranges from 1.0 to about 8.0, although values that exceed 8.0 might be realized in certain embodiments.

The computed gain value for the current block of digital audio samples can then be applied to the samples in the block (task 422). In practice, task 422 modifies, adjusts, or otherwise changes the current block of digital audio samples. More specifically, task 422 modifies each sample in the current block by multiplying the original sample value by $g_k$, resulting in a gain-adjusted sample value. As mentioned above with reference to the process 300, the gain-adjusted sample values are sent to the remotely-located media player, which can then present the media stream with a normalized loudness. FIG. 4 depicts task 422 leading back to task 412 as an indication of the potentially ongoing block-by-block nature of the process 400. As described previously, the process 400 can be initially performed for the fast adaptation mode (using the linearly adjusted set of weighting factors) and then repeated for the steady state mode (using a fixed set of weighting factors).

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A non-transitory and tangible computer-readable medium having instructions operable to cause a digital media processing device to perform operations for a media stream, comprising:
   calculating, by the digital media processing device, a loudness estimate for a current block of digital audio samples in the media stream, the loudness estimate calculated as a sum of magnitudes of the digital audio samples contained in the current block;
   calculating, by the digital media processing device, a reference gain value for the current block of digital audio samples, the reference gain value being equal to a constant reference loudness value divided by the loudness estimate;

calculating, by the digital media processing device, a maximum gain value for the current block of digital audio samples, based on a maximum absolute sample value in the current block of digital audio samples;

choosing, by the digital media processing device, an estimated gain value for the current block of digital audio samples, the estimated gain value being equal to either the reference gain value or the maximum gain value, whichever is less;

selecting, by the digital media processing device, either a first current gain value or a second current gain value for the current block of digital audio samples, whichever is less, the first current gain value comprising a weighted sum of the estimated gain value and a previous gain value applied to a previous block of digital audio samples in the media stream, and the second current gain value comprising the maximum gain value, to obtain a selected current gain value;

modifying, by the digital media processing device, the current block of digital audio samples by applying the selected current gain value to the digital audio samples in the current block of digital audio samples, resulting in gain-adjusted digital audio samples; and transmitting, by the digital media processing device, the gain-adjusted digital audio samples to a remotely-located media player to generate sound based on the gain-adjusted digital audio samples.

2. The computer-readable medium of claim 1, wherein the computer program product is operable to cause the digital media processing device to perform further operations, comprising:

comparing the loudness estimate to a silence threshold value; and applying a multiplicative gain value of one to the current block of digital audio samples when the loudness estimate is less than the silence threshold value.

3. The computer-readable medium of claim 1, wherein calculating the loudness estimate is performed in accordance with the expression $$L_k = \sum_{i=1}^{i=N} |a_i|,$$

where $L_k$ is the loudness estimate, $a_i$ represents the digital audio samples, and the current block includes N digital audio samples.

4. The computer-readable medium of claim 3, wherein calculating the reference gain value is performed in accordance with the expression $$g_r = \frac{L_{ref}}{L_k},$$

where $g_r$ is the reference gain value, and $L_{ref}$ is the constant reference loudness value.

5. The computer-readable medium of claim 4, wherein: calculating the maximum gain value is performed in accordance with the expression $$g_m = \frac{2^{n-1}}{a_{max}},$$

where $g_m$ is the maximum gain value, n is the number of bits per digital audio sample, and $a_{max}$ is the maximum absolute sample value in the current block of digital audio samples; and choosing the estimated gain value is performed in accordance with the expression $g_e = \min(g_r, g_m)$, where $g_e$ is the estimated gain value.

6. The computer-readable medium of claim 5, wherein the selecting is performed in accordance with the expression $g_k = \min(w_1 g_{k-1} + w_2 g_e, g_m)$, where $g_k$ is the selected current gain value, and $w_1$ and $w_2$ are weighting factors.

7. The computer-readable medium of claim 1, wherein modifying the current block of digital audio samples is performed for a predetermined time period after initializing processing of the media stream.

8. The computer-readable medium of claim 1, wherein modifying the current block of digital audio samples is performed for a predetermined number of blocks of the digital audio samples after initializing processing of the media stream.

9. The computer-readable medium of claim 1, wherein:
one digital audio sample is represented by sixteen bits; and
one block of digital audio samples is represented by 1024 digital audio samples.

10. A method of performing operations on a media stream, the method comprising:

calculating, by a digital media processing device, a loudness estimate for a current block of digital audio samples in the media stream, the loudness estimate calculated as a sum of magnitudes of the digital audio samples contained in the current block;

calculating, by the digital media processing device, a reference gain value for the current block of digital audio samples, the reference gain value being equal to a constant reference loudness value divided by the loudness estimate;

calculating, by the digital media processing device, a maximum gain value for the current block of digital audio samples, based on a maximum absolute sample value in the current block of digital audio samples;

choosing, by the digital media processing device, an estimated gain value for the current block of digital audio samples, the estimated gain value being equal to either the reference gain value or the maximum gain value, whichever is less;

selecting, by the digital media processing device, either a first current gain value or a second current gain value for the current block of digital audio samples, whichever is less, the first current gain value comprising a weighted sum of the estimated gain value and a previous gain value applied to a previous block of digital audio samples in the media stream, and the second current gain value comprising the maximum gain value, to obtain a selected current gain value;

modifying, by the digital media processing device, the current block of digital audio samples by applying the selected current gain value to the digital audio samples in the current block of digital audio samples, resulting in gain-adjusted digital audio samples; and transmitting, by the digital media processing device, the gain-adjusted digital audio samples to a remotely-located media player to generate sound based on the gain-adjusted digital audio samples.

11. The method of claim 10, further comprising:

comparing the loudness estimate to a silence threshold value; and applying a multiplicative gain value of one to the current block of digital audio samples when the loudness estimate is less than the silence threshold value.

12. The method of claim 10, wherein calculating the loudness estimate is performed in accordance with the expression $$L_k = \sum_{i=1}^{i=N} |a_i|,$$

where $L_k$ is the loudness estimate, $a_i$ represents the digital audio samples, and the current block includes N digital audio samples.

13. The method of claim 12, wherein calculating the reference gain value is performed in accordance with the expression $$g_r = \frac{L_{ref}}{L_k},$$

where $g_r$ is the reference gain value, and $L_{ref}$ is the constant reference loudness value.

14. The method of claim 13, wherein:

calculating the maximum gain value is performed in accordance with the expression $$g_m = \frac{2^{n-1}}{a_{max}},$$

where $g_m$ is the maximum gain value, n is the number of bits per digital audio sample, and $a_{max}$ is the maximum absolute sample value in the current block of digital audio samples; and choosing the estimated gain value is performed in accordance with the expression $g_e = \min(g_r, g_m)$, where $g_e$ is the estimated gain value.

15. The method of claim 14, wherein the selecting is performed in accordance with the expression $g_k = \min(w_1 g_{k-1} + w_2 g_e, g_m)$, where $g_k$ is the selected current gain value, and $w_1$ and $w_2$ are weighting factors.

16. The method of claim 10, wherein modifying the current block of digital audio samples is performed for a predetermined time period after initializing processing of the media stream.

17. The method of claim 10, wherein modifying the current block of digital audio samples is performed for a predetermined number of blocks of the digital audio samples after initializing processing of the media stream.

18. The method of claim 10, wherein:

one digital audio sample is represented by sixteen bits; and one block of digital audio samples is represented by 1024 digital audio samples.

* * * * *